US007773447B2

(12) United States Patent
Kajigaya

(10) Patent No.: US 7,773,447 B2
(45) Date of Patent: Aug. 10, 2010

(54) MEMORY CIRCUIT, SEMICONDUCTOR DEVICE AND READ CONTROL METHOD OF MEMORY CIRCUIT

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 462 days.

(21) Appl. No.: 11/976,853

(22) Filed: Oct. 29, 2007

(65) Prior Publication Data

US 2008/0100337 A1 May 1, 2008

(30) Foreign Application Priority Data

Oct. 30, 2006 (JP) .............................. 2006-294996

(51) Int. Cl.
*G11C 8/00* (2006.01)
(52) U.S. Cl. ........................... 365/230.03; 365/230.01; 365/230.06; 365/189.08; 326/38; 326/39
(58) Field of Classification Search ............ 365/230.01, 365/230.03, 230.06, 189.08; 326/38, 39
See application file for complete search history.

(56) References Cited

U.S. PATENT DOCUMENTS 6,023,439 A * 2/2000 Cliff et al. ............. 365/230.03

6,556,500 B2 * 4/2003 Heile ..................... 365/230.03
6,812,737 B2 * 11/2004 Sueyoshi et al. .............. 326/38

FOREIGN PATENT DOCUMENTS

JP   2004-258799   9/2004

* cited by examiner

*Primary Examiner*—Ahn Phung
*Assistant Examiner*—Eric Wendler
(74) *Attorney, Agent, or Firm*—McGinn IP Law Group, PLLC

(57) ABSTRACT

A memory circuit of the invention comprises N look-up tables for implementing a desired logic function of L inputs/M outputs by partitioning a memory cell array including a plurality of memory cells into portions each corresponding to at least a predetermined number of input/output paths; a decode circuit for selecting one of the N look-up tables by decoding a look-up table select signal and for selecting M memory cells to be accessed included in the selected look-up table by decoding an L-bit logic input signal of the logic function; and a select connect circuit for selectively connecting the input/output paths of the M memory cells to be accessed with an input/output bus for transmitting an M-bit logic output signal of the logic function in response to a decoded result of the decode circuit.

17 Claims, 16 Drawing Sheets

MEMORY CIRCUIT, SEMICONDUCTOR DEVICE AND READ CONTROL METHOD OF MEMORY CIRCUIT

BACKGROUND OF THE INVENTION

1. Field of the Invention

The present invention relates to a memory circuit in which a memory cell array having a plurality of memory cells is used as a look-up table for a logic function, and particularly relates to a memory circuit configured to be capable of selectively reading from a plurality of look-up tables, and read control method thereof.

2. Description of the Related Art

In recent years, in order to use LSI for various purposes, techniques for allowing users to freely change the configuration of the LSI has been achieved. For example, a programmable logic LSI is configured, in which a large number of logic circuits are arranged, logic functions and connection relations are set according to configuration data, and it is possible to achieve various logic functions by changing the configuration data. Generally when achieving a function of the logic circuit, a look-up table (LUT) corresponding to a desired logic function is configured in a memory, and thereby an arbitrary logic function capable of externally outputting a logic output signal having a predetermined number of bits corresponding to a logic input signal having a predetermined number of bits can be implemented.

In order to achieve a complex logic function, a configuration is proposed in which LUTs corresponding to a large scale logic function having many inputs and outputs are configured in a memory circuit so as to connect the LUTs in cascade (see Japanese Patent Laid-Open No. 2004-258799). By accessing the memory circuit configured in this manner many times with an input variable being changed, the large scale logic function can be achieved.

However, according to the above conventional configuration of the LUT, when implementing a logic function having extremely large scale, the number of bits of a logic input signal serving as the input variable is increased in addition to an increase in capacity of the memory circuit. As a result, the number of decode signals generated based on the logic input signal in order to select data to be accessed in the LUT is rapidly increased. For example, when implementing an n-input logic function, $2^n$ decode signals are required. Accordingly, when the LUT is configured in the memory circuit, its circuit scale is increased and an area for arranging a large number of lines is required.

Further, according to the above conventional configuration of the LUT, control for accessing a plurality of LUTs is not assumed, a problem arises in that latency when obtaining an output logic signal of the LUT is increased. Particularly, when the plurality of LUTs is configured in a memory circuit operating in a low speed, a reduction in throughput due to accumulation of latencies becomes a serious problem.

BRIEF SUMMARY OF THE INVENTION

An object of the present invention is to provide a memory circuit and the like in which a plurality of look-up tables for implementing a large scale logic function using a large capacity memory circuit, thereby achieving various logic functions, which is capable of improving throughput by sequentially accessing the respective look-up tables using pipeline control in a simple configuration without an increase in area.

An aspect of the present invention is a memory circuit comprising: N (N is an integer equal to or larger than two) look-up tables for implementing a desired logic function of L (L is an integer equal to or larger than one) inputs/M (M is an integer equal to or larger than one) outputs by partitioning a memory cell array including a plurality of memory cells into portions each corresponding to at least a predetermined number of input/output paths; a decode circuit for selecting one of said N look-up tables by decoding a look-up table select signal and for selecting M memory cells to be accessed included in the selected look-up table by decoding an L-bit logic input signal of the logic function; and a select connect circuit for selectively connecting the input/output paths of the M memory cells to be accessed with an input/output bus for transmitting an M-bit logic output signal of the logic function in response to a decoded result of said decode circuit.

According to the memory circuit of the present invention, when accessing the plurality of look-up tables configured in the memory circuit, desired M-bit data stored in a desired look-up table is read by the select connect circuit by supplying the look-up table select signal and the logic input signal which are corresponded to an address given to the memory circuit. In this case, even if the number of bits of the logic input signal is large in a large scale logic function, the decode circuit generally provided in the memory circuit can be utilized, and an increase in the circuit scale and the area due to an increase in the number of decode signals can be avoided. Further, even if the number of bits of the logic output signal is large in the large scale logic function, connection relation between the input/output paths of the memory circuit and the input/output bus on the outside can be appropriately set by the select connect circuit. Accordingly, the plurality of look-up tables for implementing the large scale logic function can be configured using a general memory circuit without an increase in the circuit scale and the chip area.

In the present invention, when reading from the selected look-up table, the M-bit logic output signal read from the M memory cells to be accessed may be output to the input/output bus through said select connect circuit, and when writing to the selected look-up table, M-bit input data input from outside through the input/output bus may be written to the M memory cells to be accessed through said select connect circuit.

In the present invention, each of said look-up tables may be configured by partitioning a memory cell array including a plurality of memory cells formed at intersections between a plurality of word lines and a plurality of bit lines into portions each corresponding to at least a predetermined number of bit lines, and said decode circuit may generate a plurality of decode signals for selecting word lines and bit lines corresponding to the M memory cells to be accessed.

In the present invention, said decode circuit may include a row decoder for selectively activating the plurality of word lines by decoding part of the L-bit logic input signal, and a complex decoder for selecting one of said N look-up tables by decoding the look-up table select signal and for selecting a bit line group corresponding to the M memory cells to be accessed by decoding the other part of the L-bit logic input signal.

In the present invention, a word line hierarchy structure including a plurality of main word lines selectively activated by the row decoder and a plurality of sub-word lines arranged individually for each of said look-up tables may be formed, and a sub-word line connection circuit for switching connection between the plurality of main word lines and the plurality of sub-word lines may be provided in each of said look-up tables. In this case, a predetermined number of the sub-word lines may be corresponded to each of the main word lines in the word line hierarchy structure, and the sub-word line connection circuit may be capable of selectively connecting a selected main word line to one of the predetermined number of sub-word lines corresponding to a decoded result of said decode circuit.

In the present invention, a plurality of sense amplifiers connected to the plurality of bit lines and said select connect circuit for selectively connecting the plurality of sense amplifiers to the input/output bus may be arranged at one ends in a bit line extending direction of said N look-up tables. In this case, said select connect circuit may include N selectors corresponding to said plurality of look-up tables, and each of the selectors selectively may connect M sense amplifiers corresponding to the decode signal with the input/output bus of M bits. Further, the respective selector may include a plurality of unit circuits arranged corresponding to the M sense amplifiers, and the M sense amplifiers may be connected to the input/output bus of M bits through one unit circuit selected in response to the decode signal.

In the present invention, a plurality of sense amplifiers connected to the plurality of bit lines and said select connect circuit for selectively connecting the plurality of sense amplifiers to M/2-bit lines included in the input/output bus may be arranged symmetrically at both ends in a bit line extending direction of said N look-up tables. In this case, said select connect circuit may include 2N selectors corresponding to said look-up tables, and each of the selectors may selectively connect M/2 sense amplifiers corresponding to the decode signal with M/2-bits lines included in the input/output bus. Further, the respective selector may include a plurality of unit circuits arranged corresponding to the M/2 sense amplifiers, and the M/2 sense amplifiers may be connected to the M/2-bit lines included in the input/output bus through one unit circuit selected in response to the decode signal.

In the present invention, the memory cell array may be divided into a plurality of unit blocks aligned in a bit line extending direction, said N look-up tables may be configured in each of the unit blocks, said select connect circuit may be dividedly arranged at both ends of the plurality of unit blocks and between adjacent two unit blocks, and said select connect circuit arranged between the two unit blocks may be shared by 2N said look-up tables on the both sides.

Meanwhile, an aspect of the present invention is a semiconductor device comprising: a plurality of logic blocks each including a plurality of memory circuits in which said N look-up tables are configured, and a logic circuit for performing a predetermined logic function by selectively reading from said N look-up tables through the input/output bus by said select connect circuit; and a plurality of connecting circuits for changeably setting a connection state between the plurality of logic blocks. In this case, the memory circuit may be a DRAM circuit.

Further, an aspect of the present invention is a read control method for performing an read operation for said N look-up tables in a predetermined reading order, comprising the steps of: performing a first read operation in which the L-bit logic input signal is supplied to said decode circuit at a first timing, the look-up table of a first position of the reading order is selected based on the look-up table select signal, the M memory cells to be accessed are selected and accessed, and the M-bit logic output signal is read through the input/output bus after a predetermined delay time elapses from the first timing; performing a second read operation in which the L-bit logic input signal is supplied to said decode circuit at a second timing, the look-up table of a second position of the reading order is selected based on the look-up table select signal, the M memory cells to be accessed are selected and accessed, and the M-bit logic output signal is read through the input/output bus after a predetermined delay time elapses from the second timing; and performing read operations for all said look-up tables included in the reading order by repeatedly performing a series of operations in which the first read operation is performed for a preceding look-up table and the second read operation is performed for a subsequent look-up table.

According to the read control method of the present invention, when sequentially reading from the N look-up tables, for example, an i-th look-up table is accessed at the first timing, and before this read operation is completed, an (i+1)-th look-up tables is accessed at the second timing. Accordingly, a time required when reading from the plurality of look-up tables repeatedly in accordance with the pipeline control is shortened, and the logic operation can be performed at higher speed due to improvement in throughput.

In the read control method of the present invention, the first and second operations may be controlled in synchronization with a clock signal having a predetermined period, and a time difference between the first and second timings may be equal to one cycle of the clock signal.

As described above, according to the present invention, when accessing the look-up table corresponding to a predetermined logic function, the look-up table select signal and the logic input signal are supplied to the decode circuit, thereby M memory cells to be accessed can be read to the input/output bus through the select connect circuit. In this manner, by adding the select connect circuit to a large scale memory circuit, a desired output based on one or more large scale logic functions can be obtained. Thus, the plurality of look-up tables can be configured with a simple configuration and small area while effectively utilizing hardware of a well-known memory circuit.

Further, according to the present invention, when accessing a plurality of look-up tables in a predetermined reading order, read operation is rapidly performed using the pipeline control, thereby improving throughput while avoiding an increase in latency. Thus, even if a high-speed memory circuit is not used, reading speed when the plurality of look-up tables is repeatedly accessed is improved so that an efficient logic operation can be performed.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiments of the present invention will be described with reference to the accompanying drawings. Hereinafter, five embodiments will be described in which a plurality of look-up tables (hereinafter referred to as "LUT") for implementing a desired logic function is configured using DRAM.

First Embodiment

Figure 1:
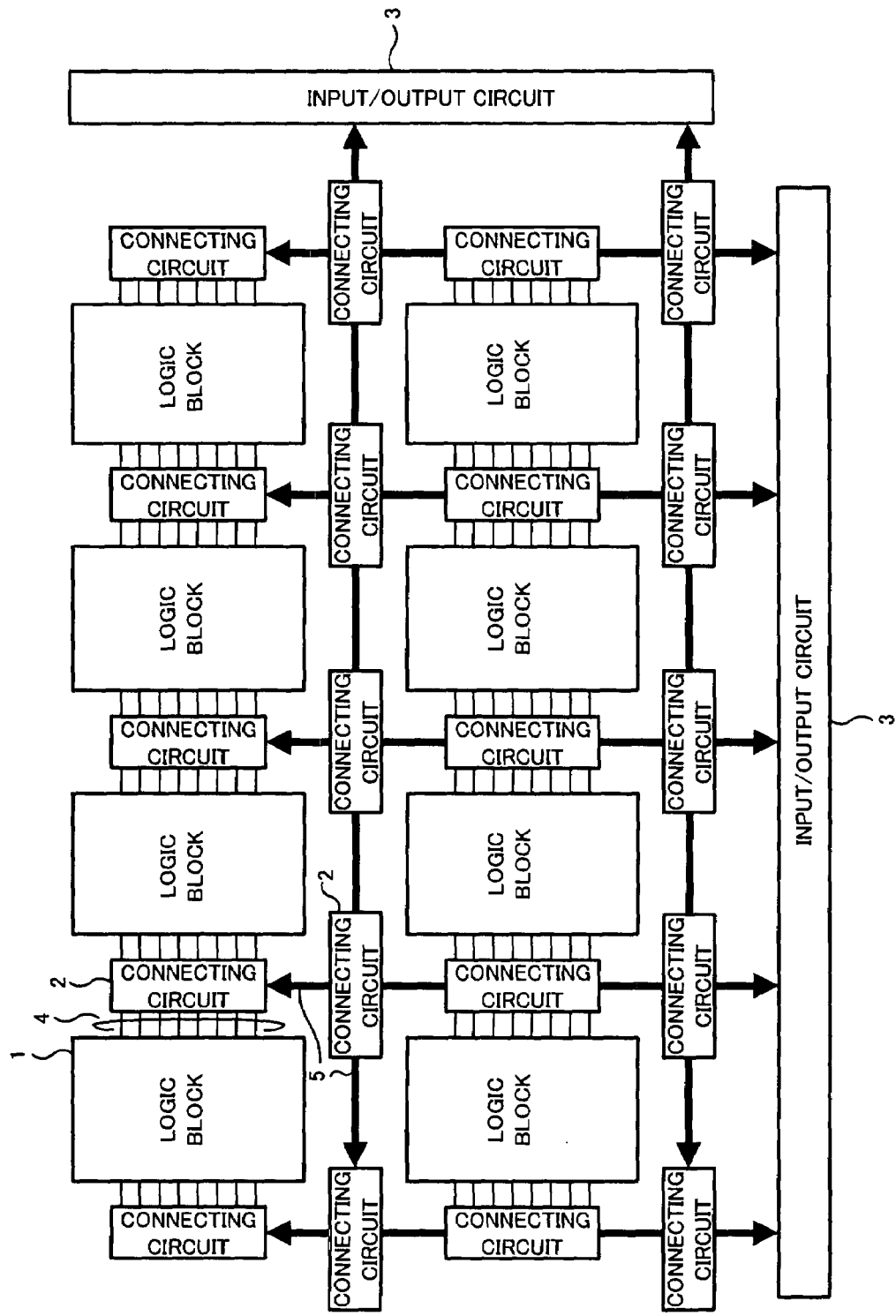
FIG. 1 is a block diagram showing an entire configuration of a programmable logic LSI as an example of a semiconductor device of a first embodiment.
Figure 2:
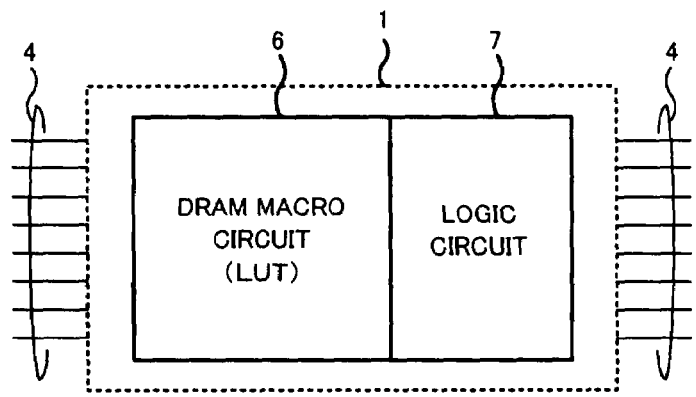
FIG. 2 is a block diagram showing a configuration of a logic block of FIG. 1.
Figure 3:
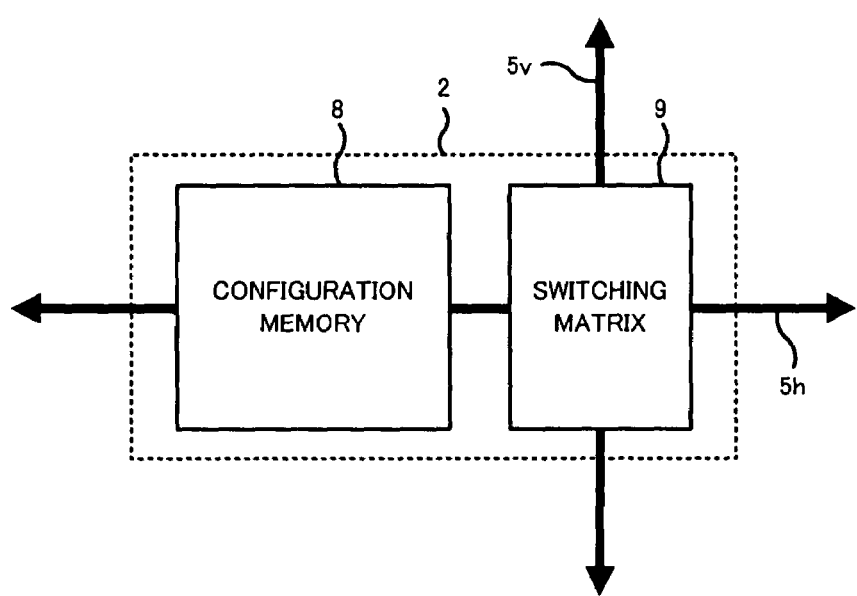
FIG. 3 is a block diagram showing a configuration of a connecting circuit of FIG. 1.

In a first embodiment, a case will be described in which a semiconductor device including a DRAM having a plurality of LUTs. FIG. 1 is a block diagram showing an entire configuration of a programmable logic LSI as an example of the semiconductor device of the first embodiment. The programmable logic LSI as shown in FIG. 1 includes a plurality of logic blocks 1 each serving as a predetermined logic function, a plurality of connecting circuits 2 for switching connection paths of data input/output from/to the logic blocks 1, two input/output circuits 3 for transmitting data between inside and outside the semiconductor device. Further, input/output lines 4 connecting between the logic blocks 1 and the connecting circuits 2, and a connection bus 5 connecting between the connecting circuits 2 and between each connecting circuit 2 and each input/output circuit 3 are arranged. FIGS. 2 and 3 show configurations of the logic block 1 and the connecting circuit 2, respectively included in the configuration of FIG. 1.

The logic block 1 is a circuit for achieving a predetermined function represented by the logic function of the LUT. As shown in FIG. 2, the logic block 1 includes a DRAM macro circuit 6 functioning as a plurality of LUTs and a logic circuit 7 for performing a predetermined logic operation. The DRAM macro circuit 6 having the plurality of LUTs rewritably stores LUT data different from one another, and desired LUT data can be selectively read from the DRAM macro circuit 6. Input/output data having a predetermined number of bits is transmitted through the input/output lines 4 connected to the logic block 1, as described later, and the logic block 1 can perform a logic operation using the LUTs through the input/output lines 4. In addition, FIG. 2 shows an example in which eight lines are included in the input/output lines 4, but the actual bit width changes according to a circuit configuration.

As shown in FIG. 3, the connecting circuit 2 includes a configuration memory 8 for storing configuration data, and a switching matrix 9 having a large number of switches arranged in a matrix form. Connection state of the switch matrix 9 is designated based on the configuration data stored in the configuration memory 8. In the switch matrix 9, the large number of switches can be selectively connected to a horizontal connection bus 5h or a vertical connection bus 5v in accordance with the designated connection state. The horizontal connection bus 5h has lines extending in a horizontal direction, and the vertical connection bus 5v has lines extending in a vertical direction. In this case, the connection state of the switching matrix 9 can be freely changed by rewriting the configuration data of the configuration memory 8.

Returning to FIG. 1, ten of twenty connecting circuits 2 are connected to the logic blocks 1 adjacent in the horizontal direction through the input/output lines 4, and the remaining ten connecting circuits 2 are connected to the connecting circuits 2 and the input/output circuits 3 adjacent in the horizontal or vertical direction through the connection bus 5. By such connections, data can be transferred between an arbitrary logic block 1 and the outside through the plurality of connecting circuits 2 and the input/output circuit 3.

Although the example of the programmable logic LSI in FIG. 1 includes eight logic blocks 1 and twenty connecting circuits 2, the number of the logic blocks 1 and the number of the connecting circuits 2 can be freely selected. Further, the arrangement and the connection form of the logic blocks 1, the connecting circuits 2 and the input/output circuits 3 are not limited to FIG. 1, and can be variously selected.

Figure 4:
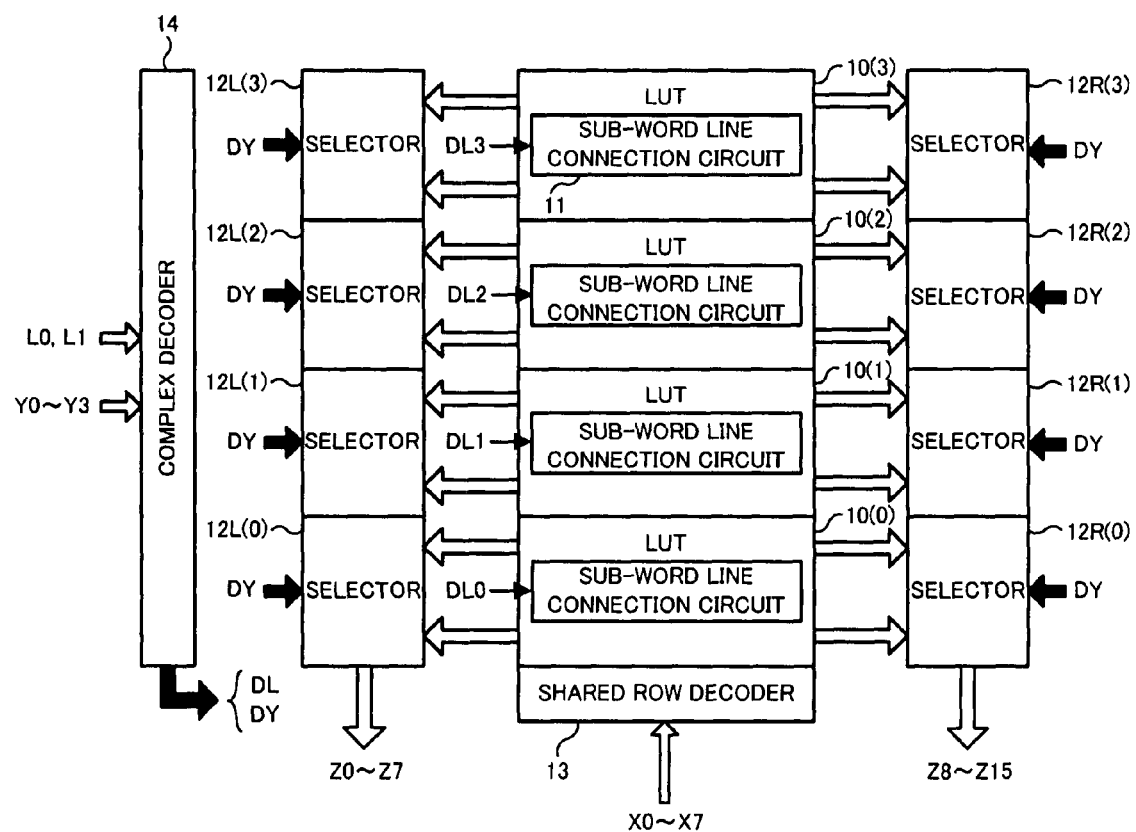
FIG. 4 is a block diagram showing a schematic configuration of a DRAM macro circuit of the first embodiment.

Next, specific configuration and operation of the DRAM macro circuit 6 in the logic block 1 will be described. FIG. 4 is a block diagram showing a schematic configuration of the DRAM macro circuit 6 of the first embodiment. The DRAM macro circuit 6 as shown in FIG. 4 includes four LUTs 10 configured in a memory cell array, four sub-word line connection circuits 11 provided in the respective LUTs, four selectors 12L and four selectors 12R respectively arranged on both sides of the four LUTs, a shared row decoder 13, and a complex decoder 14 having functions of both a column decoder and a LUT select decoder. In FIG. 4, numbers in parentheses are added to the LUTs 10 and the selectors 12L and 12R respectively so as to distinguish them from one another such as LUTs 10(0) to 10(3), selectors 12L(0) to 12L(3), selectors 12R(0) to 12R(3).

In the above configuration, the shared row decoder 13 and the complex decoder 14 integrally serve as a decode circuit of the present invention. Further, the selectors 12L and 12R serve as a select connect circuit of the present invention.

The memory cell array in which the four LUTs 10 are configured includes a large number of memory cells formed at intersections between a plurality of bit lines and a plurality of word lines (sub-word lines) intersecting therewith. A plurality of sense amplifiers (not shown) is arranged at both ends in a bit line extending direction of each LUT 10. Detailed configurations of the memory cell array and the plurality of sense amplifiers will be described later. In each LUT 10, LUT data used in an operation of a predetermined logic function of 12 inputs/16 outputs is stored in memory cells.

The sub-word line connection circuits 11 in the respective LUTs 10 are circuits for connecting a selected main word line to a corresponding sub-word line in a selected LUT 10 among the four LUTs 10. Meanwhile, the shared row decoder 13 is arranged at one end in a word line extending direction of the LUTs 10, and selectively activates one of a plurality of main word lines in response to input 8-bit logic input signals X0 to X7. The logic input signals X0 to X7 correspond to a row address for the memory cell array and are used as part of (8 bits of 12 bits) an input of the logic function implemented by the LUTs 10. The main word lines extend over the four LUTs 10, while the sub-word lines extend independently of one another in each LUT 10. This word line hierarchy structure enables to shorten the length of the sub-word lines so as to achieve high-speed operation.

In each selector 12L arranged on the left side of each LUT 10, 8 bits to be accessed of the LUT data stored in the LUT 10 are output as logic output signals Z0 to Z7 through an input/output bus. Similarly, in each selector 12R arranged on the right side of each LUT 10, 8 bits to be accessed of the LUT data stored in the LUT 10 are output as logic output signals Z8 to Z15 through the input/output bus. Then, 16-bit logic output signals Z0 to Z15 are overall output from a pair of the selectors 12L and 12R. This logic output signals Z0 to Z15 are sent to the logic circuit 7 of FIG. 2, and are used as an output of the logic function implemented by the LUTs 10. A configuration of the LUT 10 will be described later in detail.

The complex decoder 14 includes a LUT select decoder for selecting one LUT 10 from the four LUTs 10 in response to 2-bit LUT select signals L0 and L1 and a column decoder for selecting a certain bit line in response to 4-bit logic input signals Y0 to Y3. The LUT select signals L0 and L1 and the logic input signals Y0 to Y3 correspond to a column address for the memory cell array. Further, the logic input signals Y0 to Y3 are used as part of (4 bits of 12 bits) an input of the logic function implemented by the LUTs 10, and the input of 12 bits is defined by the above logic input signals X0 to X7 of the shared row decoder 13 and the logic input signals Y0 to Y3 of the complex decoder 14.

The complex decoder 14 outputs four decode signals DL (DL0, DL1, DL2, DL3) corresponding to the decoded result of the LUT select signals L0 and L1, and one decode signal DL corresponding to an access target among the LUTs 10(0) to 10(3) is selectively activated. Further, the complex decoder 14 generates sixteen decode signals DY corresponding to the decoded result of the logic input signals Y0 to Y3, and outputs the sixteen decode signals DY to each of the eight selectors 12L and 12R. One decode signal DY among them is selectively activated.

As a result, read data on a bit line selected by the complex decoder 14 is amplified by a sense amplifier (not shown), and thereafter is output as the logic output signals Z0 to Z7 and Z8 to Z15 through the input/output bus.

Figure 5:
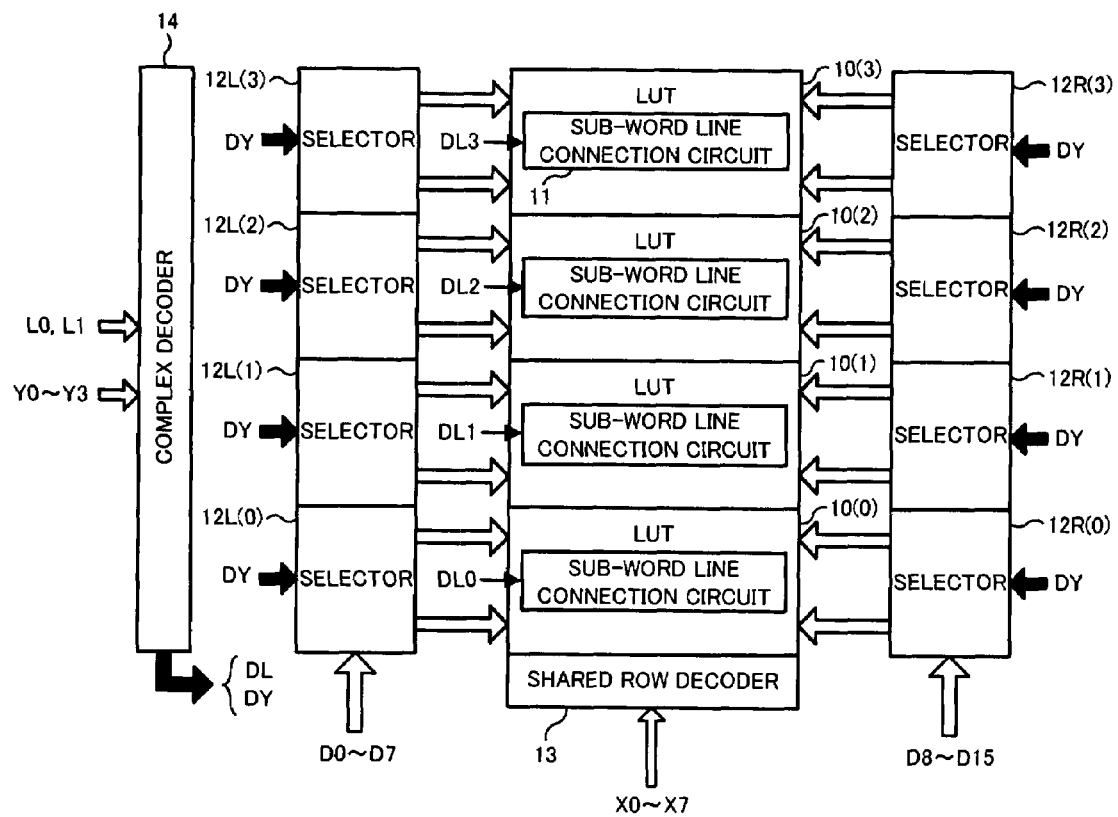
FIG. 5 is a block diagram corresponding to FIG. 4 when writing to a LUT.

In the first embodiment, the block diagram when reading out from the four LUTs 10 is shown in FIG. 4, however it is possible to write predetermined data from outside to an arbitrary LUT 10 when changing the contents of the LUT 10. FIG. 5 is a block diagram corresponding to FIG. 4 when writing to the LUT 10. Respective elements shown in FIG. 5 are common to those in FIG. 4, however a difference exists in that 16-bit write data D0 to D15 from outside are input to the selectors 12L and 12R on the both sides through the input/output bus. That is, 8-bit write data D0 to D7 is input to the left side selectors 12L, 8-bit write data D8 to D15 is input to the right side selectors 12R, and they are sent to the respective LUTs 10 and are written to the memory cells. In this manner, transfer paths of the read operation in FIG. 4 and the write operation in FIG. 5 are reverse to each other, while otherwise configuration and operation thereof are the same as each other.

Figure 6:
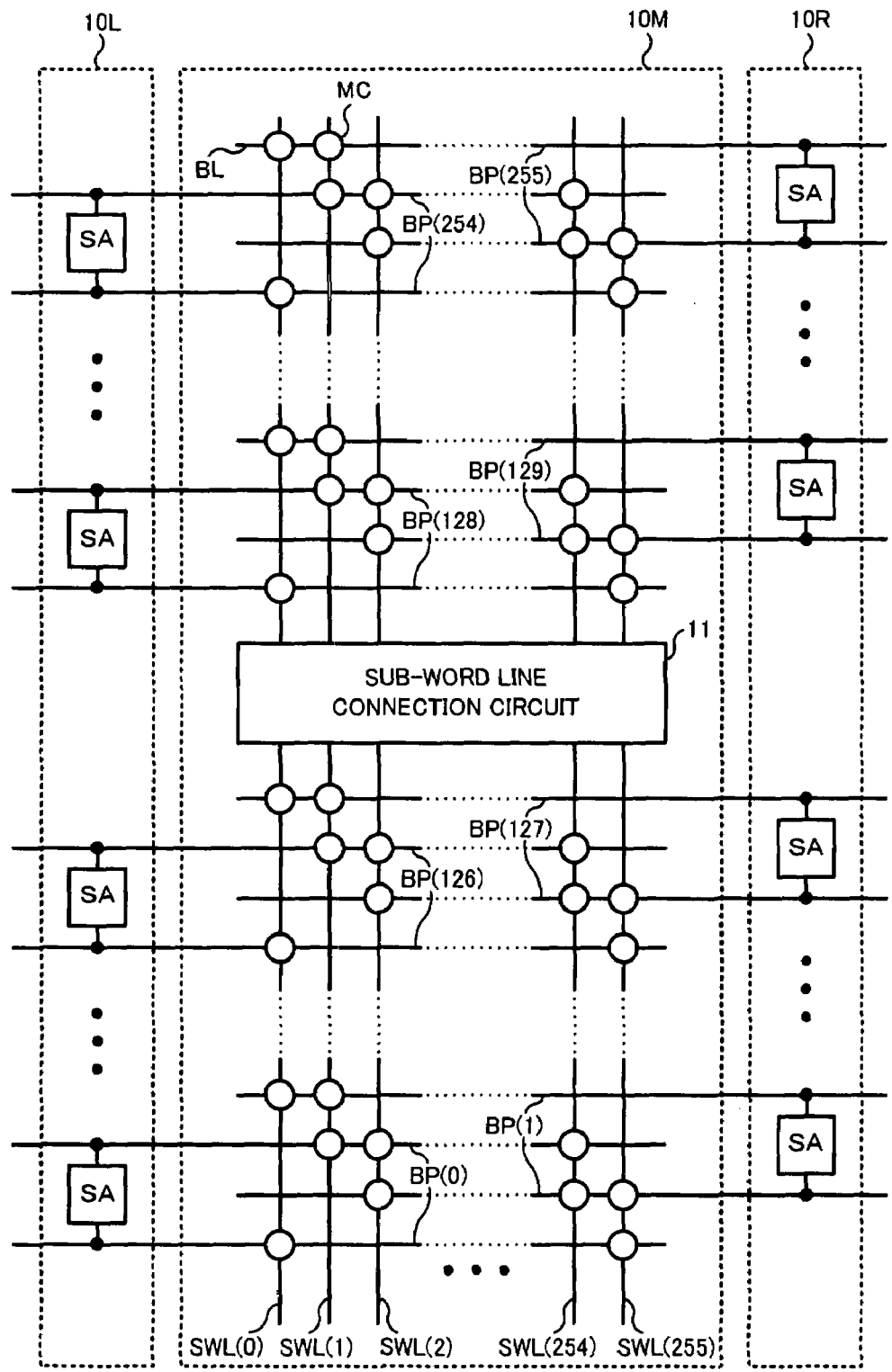
FIG. 6 is a diagram showing a specific configuration including a memory cell array serving as the LUT and rows of sense amplifiers arranged on both sides of the memory cell array.

Next, configuration and operation of the DRAM macro circuit 6 of FIG. 4 will be described in detail using FIGS. 6 to 9. FIG. 6 shows a specific configuration including a memory cell array 10M serving as the LUT 10 and rows of sense amplifiers 10L and 10R arranged on both sides of the memory cell array 10M. In the memory cell array 10M, a plurality of sub-word lines SWL and a plurality of bit lines BL intersecting therewith are arranged, and a large number of memory cells MC are formed at intersections between the sub-word lines SWL and the bit lines BL.

Two bit lines BL as a set constitute a bit line pair BP. As shown by numbers in parentheses added to the bit line pairs BP of FIG. 6, 256 bit line pairs BP(0) to BP(255) are included, and 512 bit lines BL are arranged. A single memory cell MC is formed at one of two intersections between each bit line pair BP and one sub-word line SWL. The arrangement pattern for the intersections of memory cells MC of FIG. 6 is an example, and thus various arrangement patterns capable of storing the same data can be employed.

The sub-word line connection circuit 11 is arranged at the center of the memory cell array 10M. That is, the sub-word line connection circuit 11 is arranged between the bit line pair BP(127) and the bit line pair BP(128), and 128 bit line pairs BP are arranged respectively in the upper and lower sides thereof. The sub-word line connection circuit 11 is a circuit for switching the connection state between a plurality of main word lines MWL (see FIG. 7) and a plurality of sub-word lines SWL based on the above decode signal DL. As shown by numbers in parentheses added to the sub-word lines SWL of FIG. 6, 256 sub-word lines SWL(0) to SWL(255) are arranged, each of which can be selectively connected to a corresponding main word line respectively.

Figure 7:
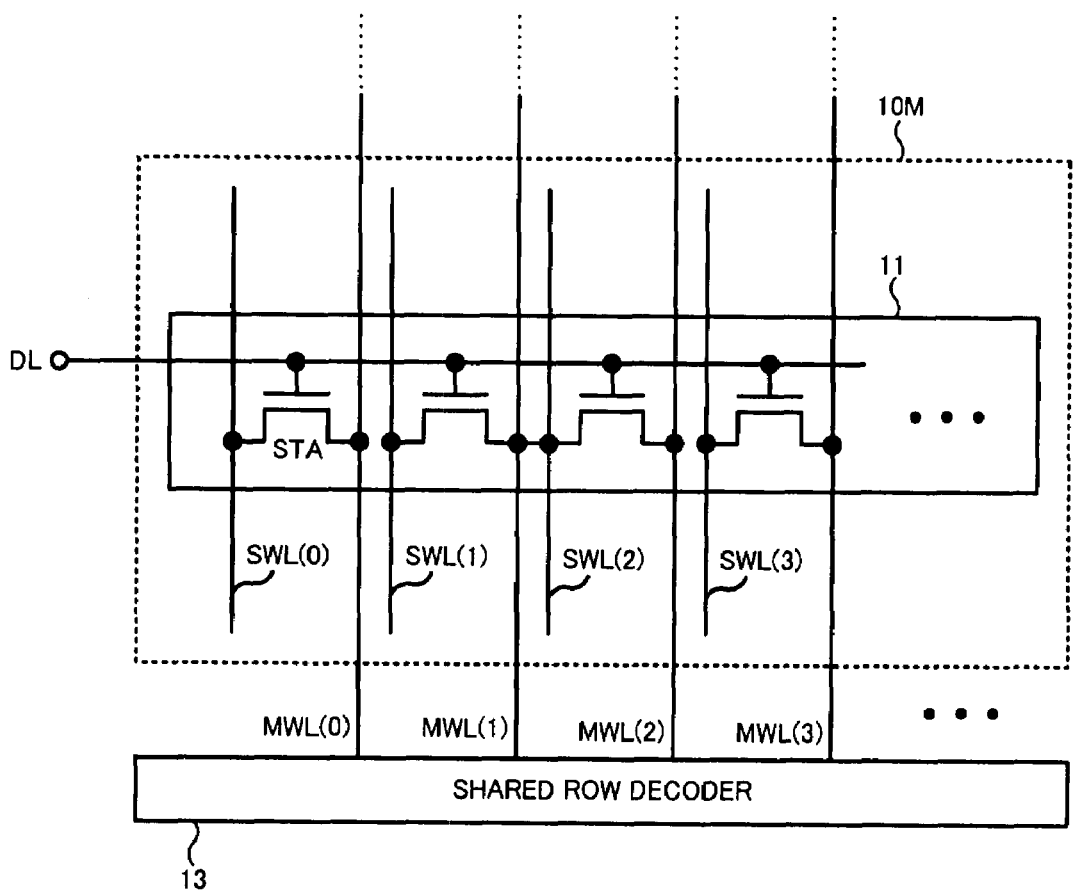
FIG. 7 is a diagram showing a circuit configuration of a sub-word line connection circuit of the first embodiment.

Here, FIG. 7 shows a circuit configuration of the sub-word line connection circuit 11. The sub-word line connection circuit 11 shown in FIG. 7 includes 256 select transistors STA. Each select transistor STA is connected between one main word line MWL and one sub-word line SWL, and one decode signal DL is applied to commonly connected gates of the select transistors STA. For example, a first main word line MWL(0) is connected to a first sub-word line SWL(0) through the select transistor STA. Although four main word lines MWL and four sub-word lines SWL are shown in FIG. 7, connection states between 256 main word lines MWL and 256 sub-word lines SWL in total can be switched by 256 select transistors STA.

In FIG. 7, the main word lines MWL and the sub-word lines SWL are arranged in parallel with the same pitch, while they are formed in different layers. For example, the sub-word lines SWL which are directly connected to the memory cells MC are formed of polysilicon, and the main word lines MWL are formed in an aluminum layer. Further, since the sub-word lines SWL extend in only one LUT 10, which differs from the main word lines extending over the four LUTs 10, the number the memory cells MC connected to activated lines is prevented from increasing so as to suppress operation delay. Moreover, as shown in FIG. 6, by arranging the sub-word line connection circuit 11 at the center of the memory cell array 10M, the lengths of the respective sub-word lines SWL extending in a word line extending direction of both sides of the sub-word line connection circuit 11 become equal so as to shorten delay time.

In FIG. 7, when one LUT 10 is selected to be accessed, corresponding one decode signal DL goes high, and one sub-word line SWL corresponding to selected one main word line MWL is activated. Since decode signals DL of non-selected LUTs 10 maintain low, the sub-word lines SWL therein are not activated.

Returning to FIG. 6, each of the rows of sense amplifiers 10L and 10R on the both sides includes a plurality of sense amplifiers SA each arranged corresponding to the bit line pair BP. Each sense amplifier SA has two input terminals connected between two bit lines BL of the bit line pair BP, and operates to amplify a minute potential of the bit line pair BP generated due to accumulate charge of the memory cell MC and to rewrite it to the memory cell MC. In the first embodiment, the bit line pairs BP are alternately connected to each sense amplifiers SA of the rows of sense amplifiers 10L and 10R on the both sides. Thus, as shown in FIG. 6, 128 bit line pairs BP at even numbered positions are connected to the sense amplifiers SA of the left side row of sense amplifiers 10L, and 128 bit line pairs BP at odd numbered positions are connected to the sense amplifiers SA of the right side row of sense amplifiers 10R.

Figure 8:
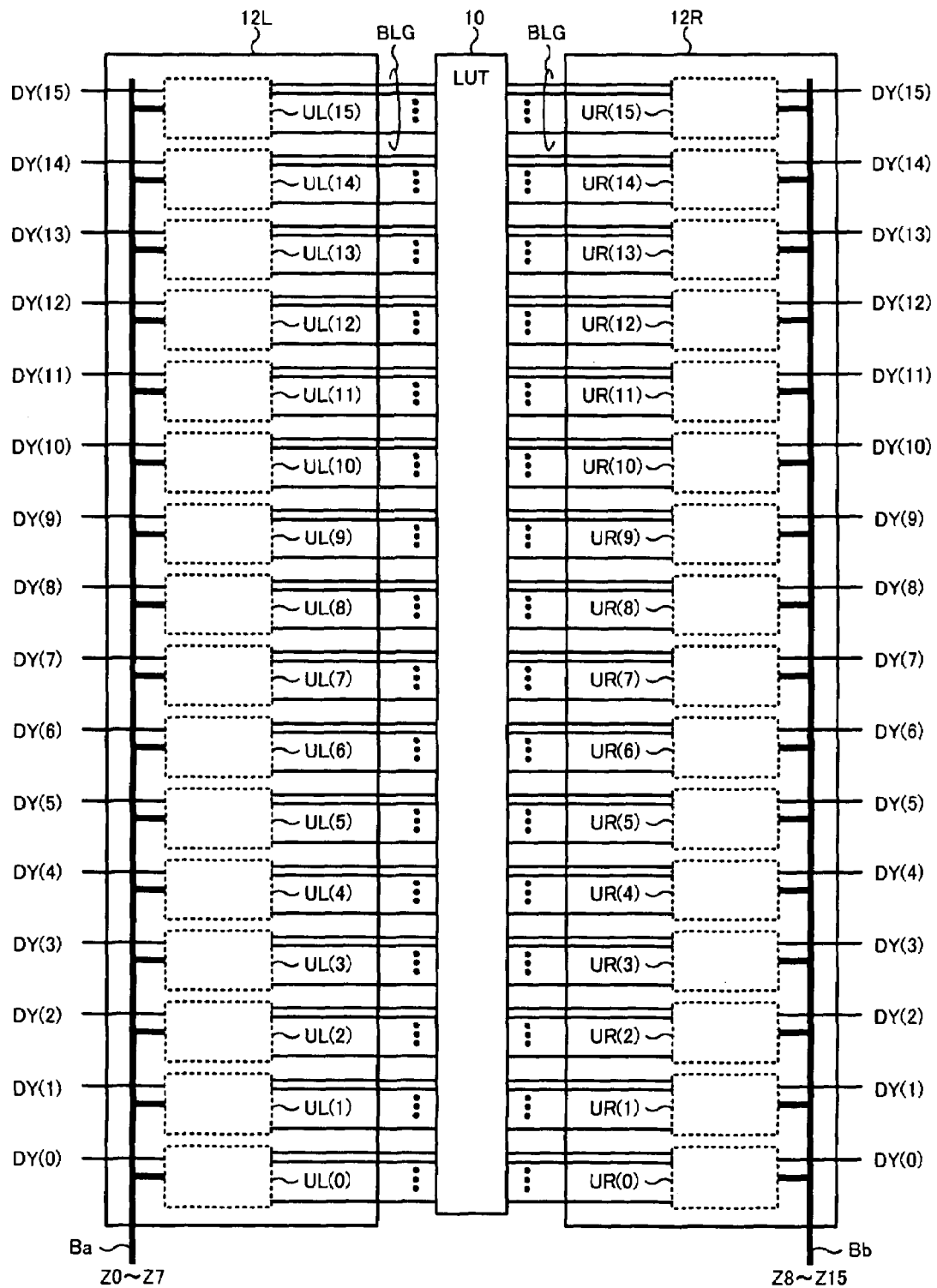
FIG. 8 is a diagram showing a configuration of selectors on both sides of the LUT of the first embodiment.

Next, FIG. 8 is a diagram showing a configuration of the selectors 12L and 12R of FIG. 4. Hereinafter, a portion including one selector 12L on the left side and one selector 12R on the right side will be described, which are arranged on both sides of one LUT 10 in FIG. 4. As shown in FIG. 8, the left side selector 12L is divided into sixteen unit circuits UL, connection states of which are controlled in response to sixteen decode signals DY different from one another. Similarly, the right side selector 12R is divided into sixteen unit circuits UR, connection states of which are controlled in response to the above sixteen decode signals DY. Numbers in parentheses are added to the unit circuits UL, UR and the decode signal DY respectively so as to distinguish them from one another such as unit circuits UL(0) to UL(15), unit circuits UR(0) to UR(15), and decode signals DY(0) to DY(15). As understood from FIG. 8, the decode signals DY(0) to DY(15) are applied to the unit circuits UL(0) to UL(15) and the unit circuits UR(0) to UR(15) on the both sides in accordance with the numerical order.

A bit line group BLG including eight bit line pairs BP is connected to each of the unit circuits UL and UR. When one decode signal DY is activated by the 4-bit logic input signals Y0 to Y3, the bit line group BLG of corresponding one unit circuit UL is connected to an 8-bit input/output bus Ba, and the bit line group BLG of corresponding one unit circuit UR is connected to an 8-bit input/output bus Bb. The 16-bit logic output signals Z0 to Z15 are obtained by combining the 8-bit logic output signals Z0 to Z7 sent from the left side input/output bus Ba and the 8-bit logic output signals Z8 to Z15 sent from the right side input/output bus Bb. In the unit circuits UL and UR corresponding to other non-activated fifteen decode signals DY, the bit line groups BLG are disconnected from the input/output buses Ba and Bb.

Figure 9:
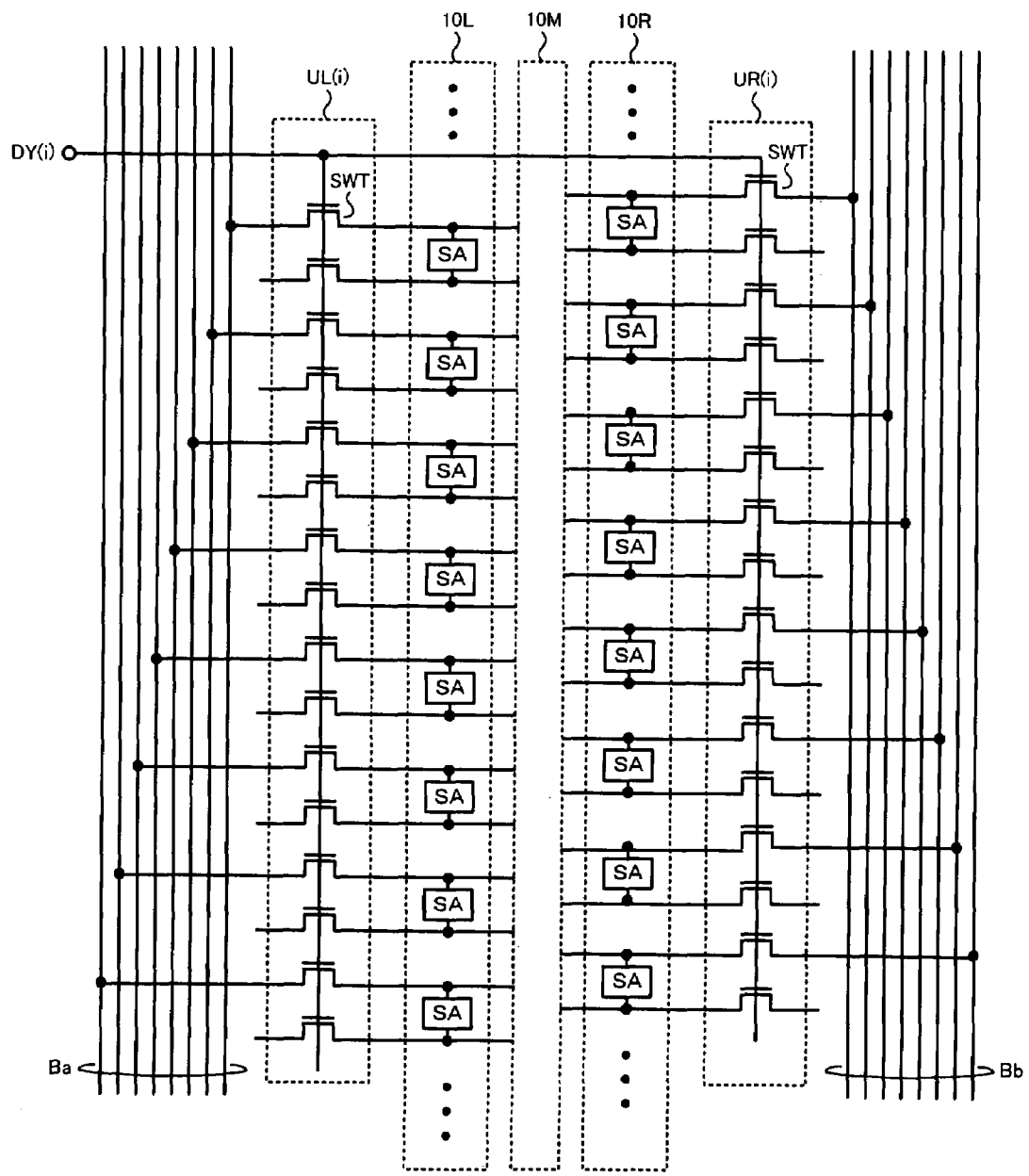
FIG. 9 is a diagram showing a circuit configuration of two unit circuits on the both sides in the configuration of FIG. 8.

FIG. 9 is a diagram showing a circuit configuration of two unit circuits UL(i) and UR(i) on the both sides each at an i-th position in the configuration of FIG. 8. The sense amplifiers SA of the rows of sense amplifiers 10L and 10R on both sides of the memory cell array 10M are shown in FIG. 9, thereby clarifying connection relation between the above bit line group BLG and the unit circuits UL(i) and UR(i). The left side unit circuit UL(i) includes sixteen switch transistors SWT having commonly connected gates to which one decode signal DY is applied.

Both ends of each sense amplifier SA are connected to one ends of two switch transistors SWT corresponding to each bit line pair BP, and the other end of one switch transistor SWT corresponding to one bit line BP of a complementary signal pair is connected to one line of the input/output bus Ba. When the decode signal DY is activated, one ends of different sense amplifiers SA can be connected to eight lines of the input/output bus Ba through the switch transistors SWT being on. In addition, the right side unit circuit UR(i) is configured in a symmetrical arrangement to the left side unit circuit UL(i), and connection to the input/output bus Bb can be controlled.

The DRAM macro circuit 6 of the first embodiment described above has a configuration suitable for configuring look-up tables for implementing a plurality of large scale logic functions. A configuration in which the 12-bit logic input signal is input to the LUT 10 of 12 inputs/16 outputs and the 16-bit logic output signal is output from the LUT 10 can be achieved with a relatively simple circuit. That is, by distributing the 12-bit logic input signal to the shared row decoder 13 and the complex decoder (column decoder) 14, an increase in the number of decode signals can be avoided. Further, in order to transmit the 16-bit logic output signal to the input/output bus, the selector 12 having NMOS transistors each single transistor of which is connected to each bit line BL in series should be provided. Thus, by employing the DRAM macro circuit 6 of the first embodiment, an increase in the chip area due to increases in the circuit scale and the number of lines is suppressed, and a plurality of look-up tables corresponding to a large scale logic function is configured so as to freely control reading and writing of the LUTs 10.

Second Embodiment

In a second embodiment, a configuration having a word line hierarchy structure different from that of the first embodiment will be described regarding a DRAM in which a plurality of LUTs 10 is configured. A semiconductor device of the second embodiment is configured in the same manner as in FIGS. 1 to 3 of the first embodiment, so description thereof will be omitted. In the following, configuration and operation of a DRAM macro circuit 6 of the second embodiment will be described.

Figure 10:
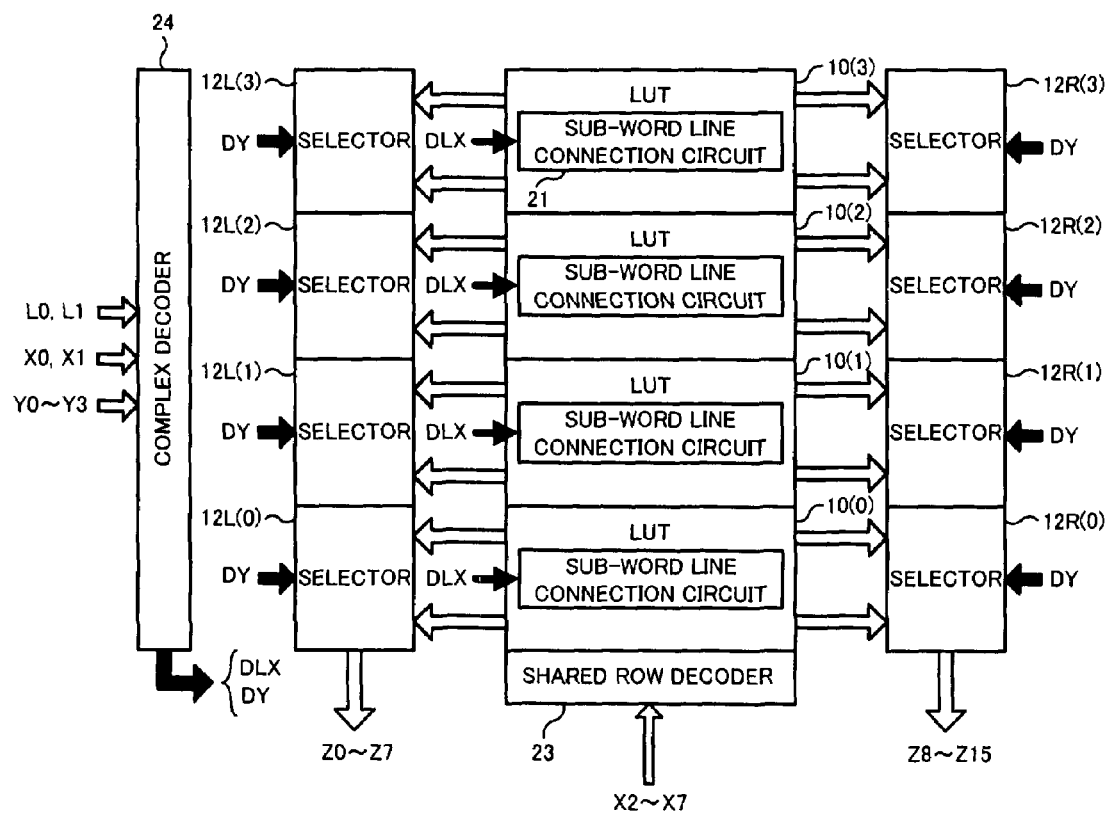
FIG. 10 is a block diagram showing a schematic configuration of a DRAM macro circuit of a second embodiment.

FIG. 10 is a block diagram showing a schematic configuration of the DRAM macro circuit 6 of the second embodiment. The DRAM macro circuit 6 as shown in FIG. 10 includes four LUTs 10, four sub-word line connection circuits 21 provided in the respective LUTs 10, four selectors 12L, four selectors 12R, a shared row decoder 23 and a complex decoder 24. Among these, the LUTs 10 and the selectors 12L and 12R are the same as those of the first embodiment, so description thereof will be omitted.

In the second embodiment, 6-bit logic input signals X2 to X7 are input to the shared row decoder 23, and thus the number of main word lines MWL which can be selected (64 lines) is a quarter of that in the first embodiment. Further, the complex decoder 24 also includes a row decoder inside LUT for selecting one of four sub-word lines SWL in response to 2-bit logic input signals X0 and X1, in addition to the LUT select decoder and the column decoder as in the first embodiment. Thus, the number of the sub-word lines SWL inside each LUT 10 is the same as in the first embodiment (256 lines). In this manner, six bits of an 8-bit row address are input to the shared row decoder 23 and two bits thereof are input to the complex decoder 24.

In FIG. 10, the complex decoder 24 outputs decode signals DY as in the first embodiment to the selectors 12L and 12R, and generates sixteen decode signals DLX corresponding to the decoded results of LUT select signals L0 and L1 and logic input signals X0 and X1, each four of which are output to each sub-word line connection circuit 21 of the four LUTs 10. One of these sixteen decode signals DLX is activated by the complex decoder 24, and it is possible to select one sub-word line SWL to be accessed in a selected LUT 10.

In addition, it is the same as the first embodiment in that a predetermined logic function of 12 inputs/16 outputs can be implemented by the respective LUTs 10. However, regarding the 12 inputs of the logic function, six bits are assigned for the shared row decoder 23, while six bits are assigned for the complex decoder. The 16 outputs of the logic function are output as 16-bit logic output signals Z0 to Z15 through the input/output bus in the selectors 12L and 12R on the both sides as in the first embodiment. Further, when writing to the LUT 10, write data D0 to D15 from outside is input to the selectors 12L and 12R through the input/output bus as in FIG. 5.

Figure 11:
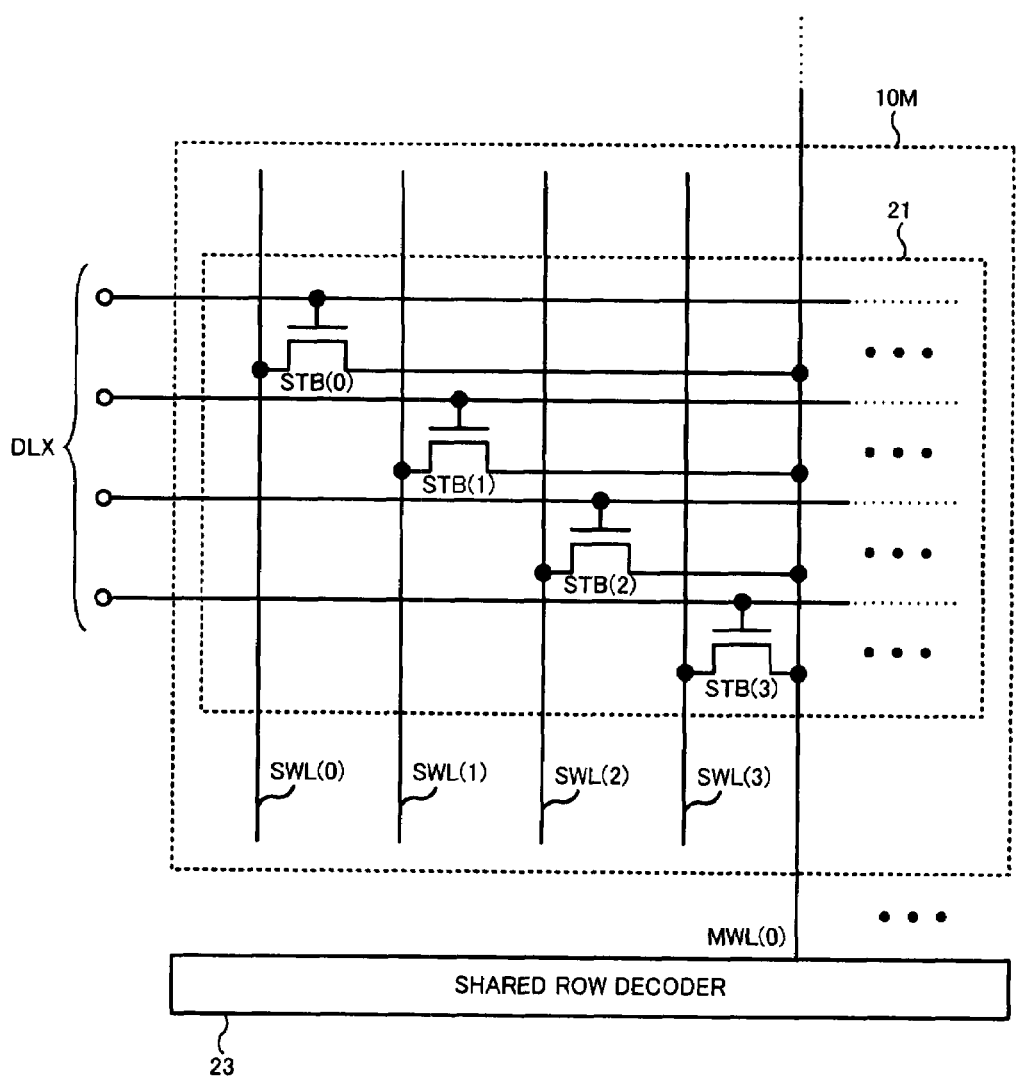
FIG. 11 is diagram showing a circuit configuration of a sub-word line connection circuit of the second embodiment.

FIG. 11 is diagram showing a circuit configuration of the sub-word line connection circuit 21 of FIG. 10. The sub-word line connection circuit 21 as shown in FIG. 11 includes 256 select transistors STB in total. It is different from the configuration of FIG. 7 in that, one main word line MWL and four sub-word lines SWL are arranged corresponding to the four select transistors STB. The four select transistors STB has gates to which decode signals DLX different from one another are applied, and are connected to one main word line MWL and sub-word lines SWL different from one another. As shown by numbers in parentheses in FIG. 11, the sub-word lines SWL(0) to SWL(3) are connected to one main word line MWL(0) in the order of the select transistors STB(0) to STB (3). Thus, when one decode signal DLX is activated, corresponding one select transistor STB turns on, and one sub-word lines SWL is selectively activated corresponding to the selected main word line MWL.

The arrangement of FIG. 11 is repeated for 64 main word lines MWL and 256 sub-word lines SWL. By comparing FIG. 11 with FIG. 7, the pitch of the sub-word lines SWL is the same, but the pitch of the main word lines MWL can be quadrupled. Thus, when the main word lines MWL are formed in an aluminum layer, the pitch thereof can be eased so as to simplify the manufacturing. When configuring a large scale LUT 10, the number of the sub-word lines SWL is increased, and therefore the arrangement of FIG. 11 is desirable.

The DRAM macro circuit of the second embodiment described above can configure a plurality of look-up tables corresponding to a large scale logic function with a simple configuration as in the first embodiment. Further, since a plurality of the sub-word lines SWL which can be selected is corresponded to one main word line MWL, the pitch of the main word lines MWL is eased so as to achieve a configuration useful for an improvement of the integration.

Third Embodiment

In a third embodiment, a DRAM having an entire configuration different from those of the first and second embodiments will be described. A semiconductor device of the third embodiment is configured in the same manner as in FIGS. 1 to 3 of the first embodiment, so description thereof will be omitted. In the following, configuration and operation of a DRAM macro circuit 6 of the third embodiment will be described.

Figure 12:
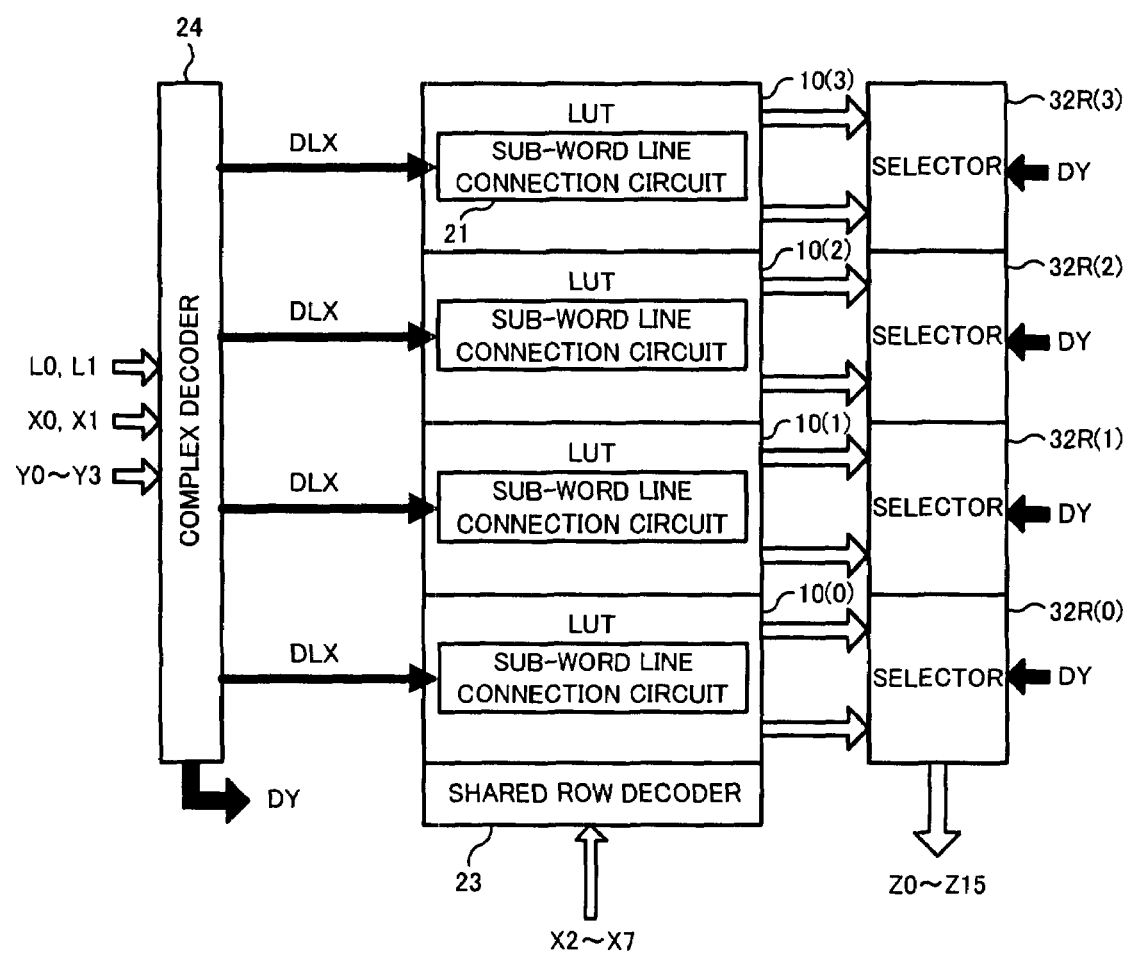
FIG. 12 is a block diagram showing a schematic configuration of a DRAM macro circuit of a third embodiment.

FIG. 12 is a block diagram showing a schematic configuration of the DRAM macro circuit 6 of the third embodiment. The DRAM macro circuit 6 as shown in FIG. 12 includes four LUTs 10, four sub-word line connection circuits 21 provided in the respective LUTs 10, four selectors 32R, a shared row decoder 23 and a complex decoder 24. In addition, the sub-word line connection circuits 21, the shared row decoder 23 and the complex decoder 24 are the same as in the second embodiment, however they can be replaced with the sub-word line connection circuits 11, the shared row decoder 13 and the complex decoder 14 in the first embodiment.

In the third embodiment, only the four selectors 32R are arranged in the right side of the four LUTs 10, and no selector is provided in the left side. Thus, FIG. 6 of the first embodiment should be modified such that only the row of sense amplifiers 10R is provided, the bit line pairs BP and the sense amplifiers SA are not alternately connected to each other while connected at the right ends of the bit line pairs BP. Further, the four selectors 32R input/output 16-bit logic output signals Z0 to Z15 from/to the outside through the input/output bus. In addition, the memory cell array 10M itself of each LUT 10 is configured in the same manner as in FIG. 6. Besides, four selectors may be arranged only on the left side of the four LUTs 10, which is symmetrical to the configuration of FIG. 12.

Figure 13:
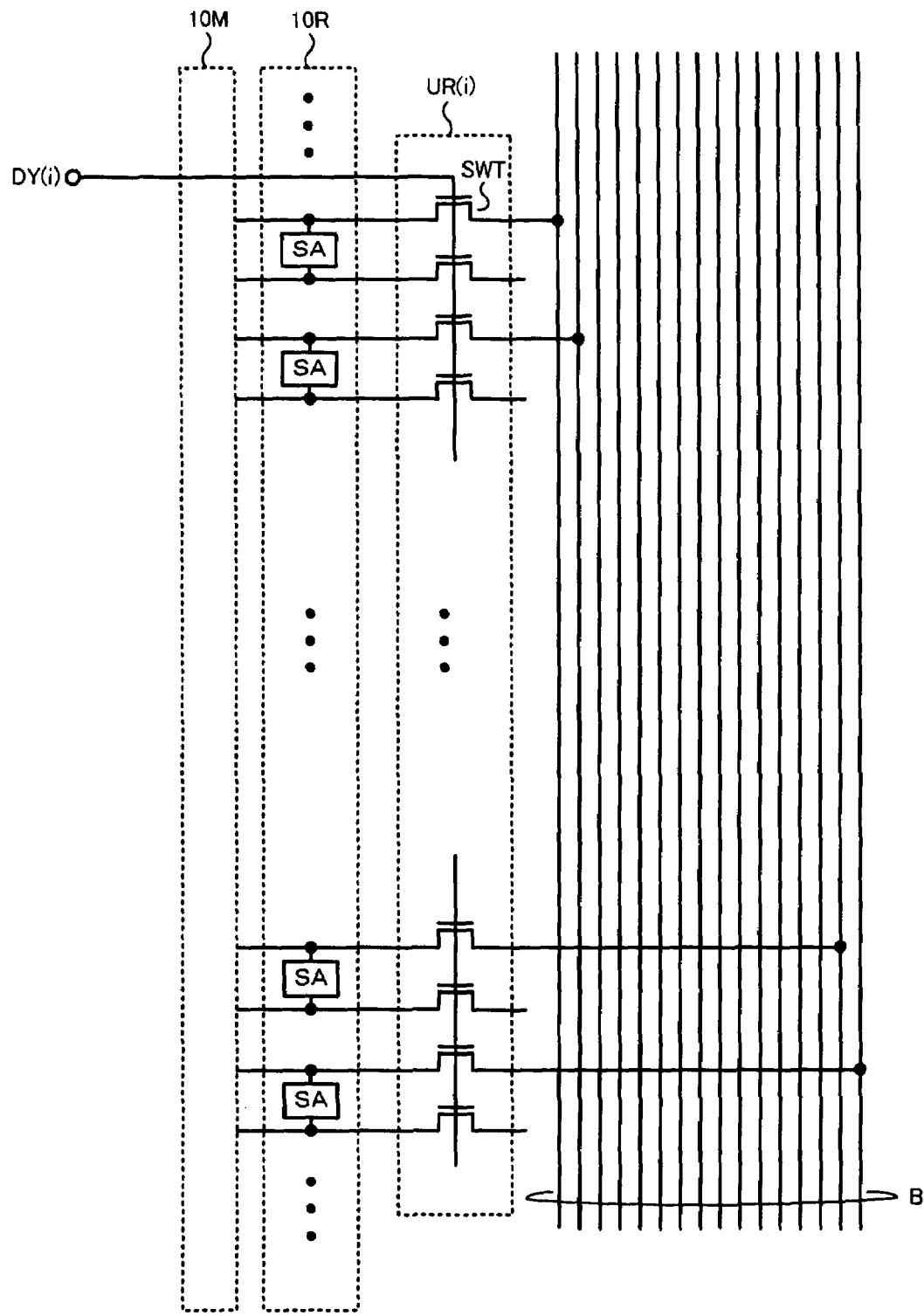
FIG. 13 is a diagram showing a circuit configuration of a unit circuit in the selector on one side in the configuration of FIG. 12.

Meanwhile, the selectors 32R are divided into sixteen unit circuits UR controlled in response to decode signals DY different from one another, similarly as in the right side selector 12R shown in FIG. 8. Here, FIG. 13 shows a circuit configuration of a unit circuit UR(i) at an i-th position in the selector 32R. In the unit circuit UR(i) of FIG. 13, connection of 16 bit line pairs BP and 16 sense amplifiers SA to 16 lines of the input/output bus B are controlled by 32 switch transistors SWT. One decode signal DY is applied to commonly connected gates of the 32 switch transistors SWT. Thus, when comparing with the unit circuit UR(i) of FIG. 9, the number of the switch transistors SWT and the number of bits of the input/output bus B are both doubled.

In addition, it is assumed that the logic function of 12 inputs/16 outputs is implemented by the LUTs 10 in FIGS. 12 and 13, however the number of the bit line pairs BP or the circuit scale of the selector 12R may be smaller when configuring the LUTs 10 for implanting logic function having a smaller number of inputs/outputs. If the pitch of the bit lines BP in the third embodiment is the same as in the first and second embodiments, the pitch of the sense amplifiers SA is reduced by half, thereby being applicable to a case in which a large number of sense amplifiers SA can be arranged with a narrow pitch.

The DRAM macro circuit 6 of the third embodiment described above has basic effects common to the first and second embodiments. Meanwhile, since the selector 32R and the row of sense amplifiers 10R are arranged on one side of the memory cell array 10M, a desirable arrangement can be achieved if the pitch is eased.

Fourth Embodiment

In a fourth embodiment, a DRAM having an entire configuration different from those of the first to third embodiments will be described. A semiconductor device of the fourth embodiment is configured in the same manner as in FIGS. 1 to 3 of the first embodiment, so description thereof will be omitted. In the following, configuration and operation of a DRAM macro circuit 6 of the fourth embodiment will be described.

Figure 14:
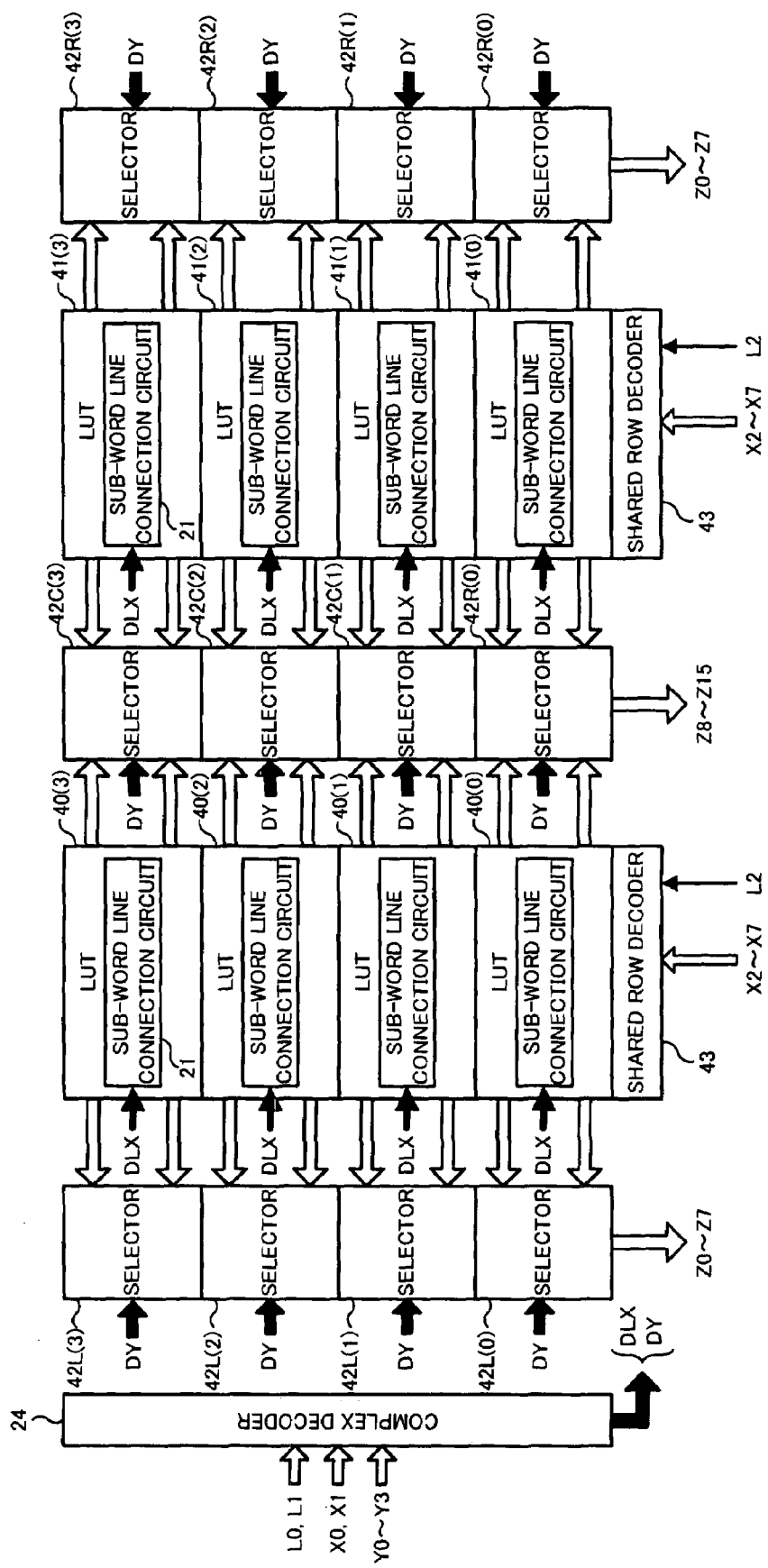
FIG. 14 is a block diagram showing a schematic configuration of a DRAM macro circuit of a fourth embodiment.

FIG. 14 is a block diagram showing a schematic configuration of the DRAM macro circuit 6 of the fourth embodiment. In the fourth embodiment, a memory cell array of the DRAM macro circuit 6 is divided into a plurality of memory mats as unit blocks. The DRAM macro circuit 6 as shown in FIG. 14 includes four LUTs 40 configured in a memory mat on the left side, four LUTs 41 configured in a memory mat on the right side, eight sub-word line connection circuits 21 provided in the memory mats 40 and 41, four selectors 42L on the left side, four selectors 42C at the center, four selectors 42R on the right side, a shared row decoder 43 and a complex decoder 24.

In FIG. 14, the left side four selectors 42L input/output 8-bit logic output signals Z0 to Z7 from/to the outside through the input/output bus. The four selectors 42C at the center input/output 8-bit logic output signals Z8 to Z15 from/to the outside through the input/output bus. The right side four selectors 42R input/output 8-bit logic output signals Z0 to Z7 from/to the outside through the input/output bus. Meanwhile, the left side four LUTs 40 are connected to the selectors 42L and 42C positioned at both sides, the right side four LUTs 41 are connected to the selectors 42C and 42R positioned at both sides. It is thus a feature that the selectors 42C at the center are shared by eight LUTs 40 and 41 of adjacent two memory mats.

Each of the two shared row decoders 43 corresponding to the two memory mats receives a 1-bit LUT select signal L2 in addition to the 6-bit logic input signals X2 to X7. 3-bit LUT select signals L0 to L2 are obtained in connection with the LUT select signals L0 and L1 of the complex decoder 24, thereby enabling selection from the eight LUTs 40 and 41 of the two memory mats. Adjacent memory mats can share a row of sense amplifiers (not show) as well as the selectors 42C. By this, if the number of memory mats is increased, the circuit scale of the selectors 42C and the row of sense amplifiers can be prevented from increasing.

In the example of FIG. 14, a case in which the eight LUTs 40 and 41 are configured in the two memory mats has been described, however a larger number of memory mats may be aligned in a bit line extending direction. For example, if K memory mats are aligned, each of 4 (K−1) selectors 42C except eight selectors 42L and 42R at the both ends are shared by adjacent two LUTs.

The DRAM macro circuit of the third embodiment described above can achieve not only the effects of the first to third embodiments but also a configuration for sharing the selectors 42C and the row of sense amplifiers by dividing the large scale DRAM macro circuit 6 into a large number of memory mats, thereby improving the integration.

Fifth Embodiment

Figure 15:
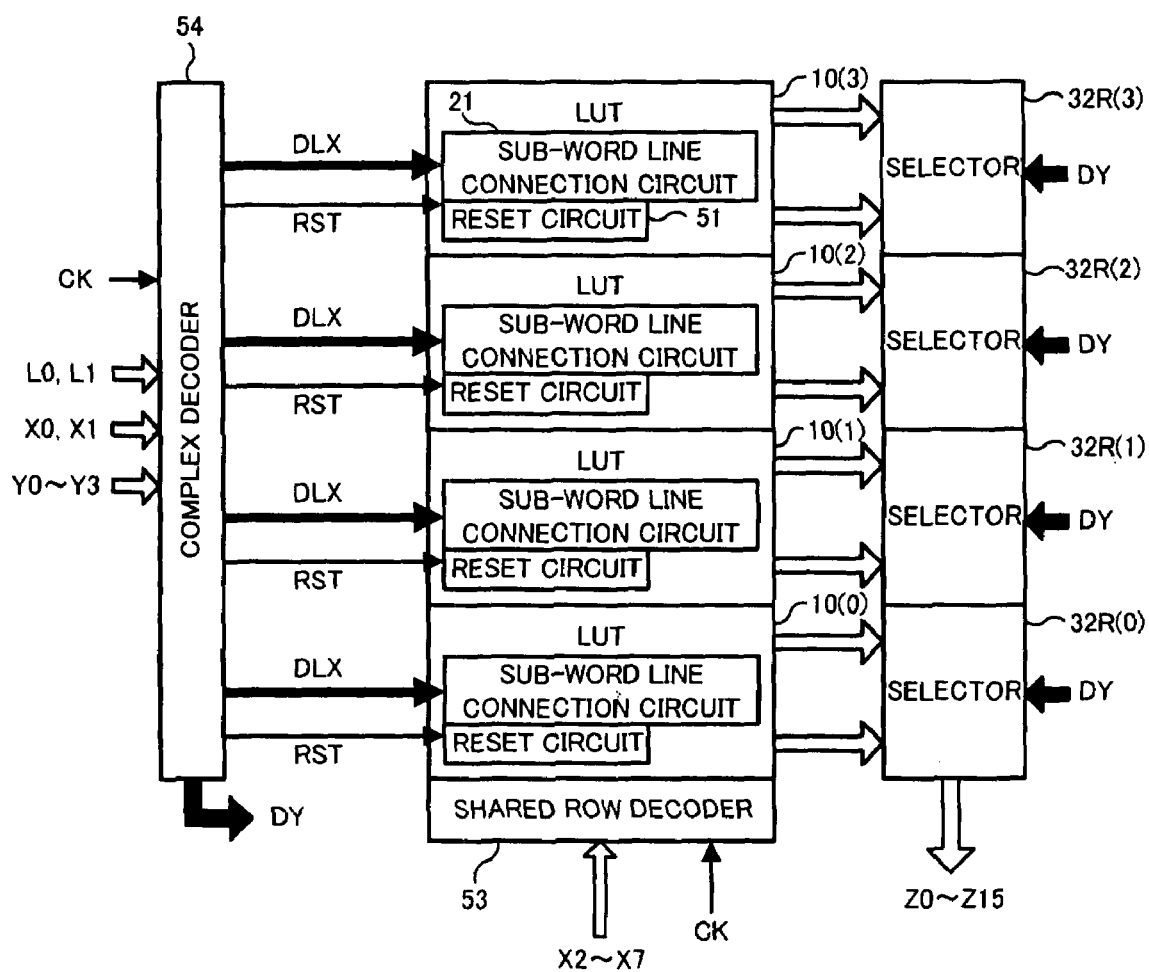
FIG. 15 is a block diagram showing a schematic configuration of a DRAM macro circuit of a fifth embodiment.

In a fifth embodiment, a case in which a plurality of LUTs 10 configured in a DRAM is accessed using pipeline control will be described. Although the fifth embodiment is applicable on the basis of any of the first to fourth embodiments, a case of having a configuration on the basis of the third embodiment to which a configuration required for the pipeline control is added will be described in the following. FIG. 15 is a block diagram showing a schematic configuration of a DRAM macro circuit 6 of the fifth embodiment. The DRAM macro circuit 6 of FIG. 15 includes four LUTs 10, four sub-word line connection circuits 21 and four reset circuit 51 respectively provided in the four LUTs, four selectors 32R, a shared row decoder 53 and a complex decoder 54. Among these, the four LUTs 10 and the four selectors 32 are the same as those of the third embodiment, so description thereof will be omitted.

In the fifth embodiment, the complex decoder 54 generates four reset signals RST to be supplied to the four reset circuits 51 in addition to the decode signals DLX and DY. Besides, a clock signal CK for controlling timings of the pipeline control is supplied to the shared row decoder 53 and the complex decoder 54.

Figure 16:
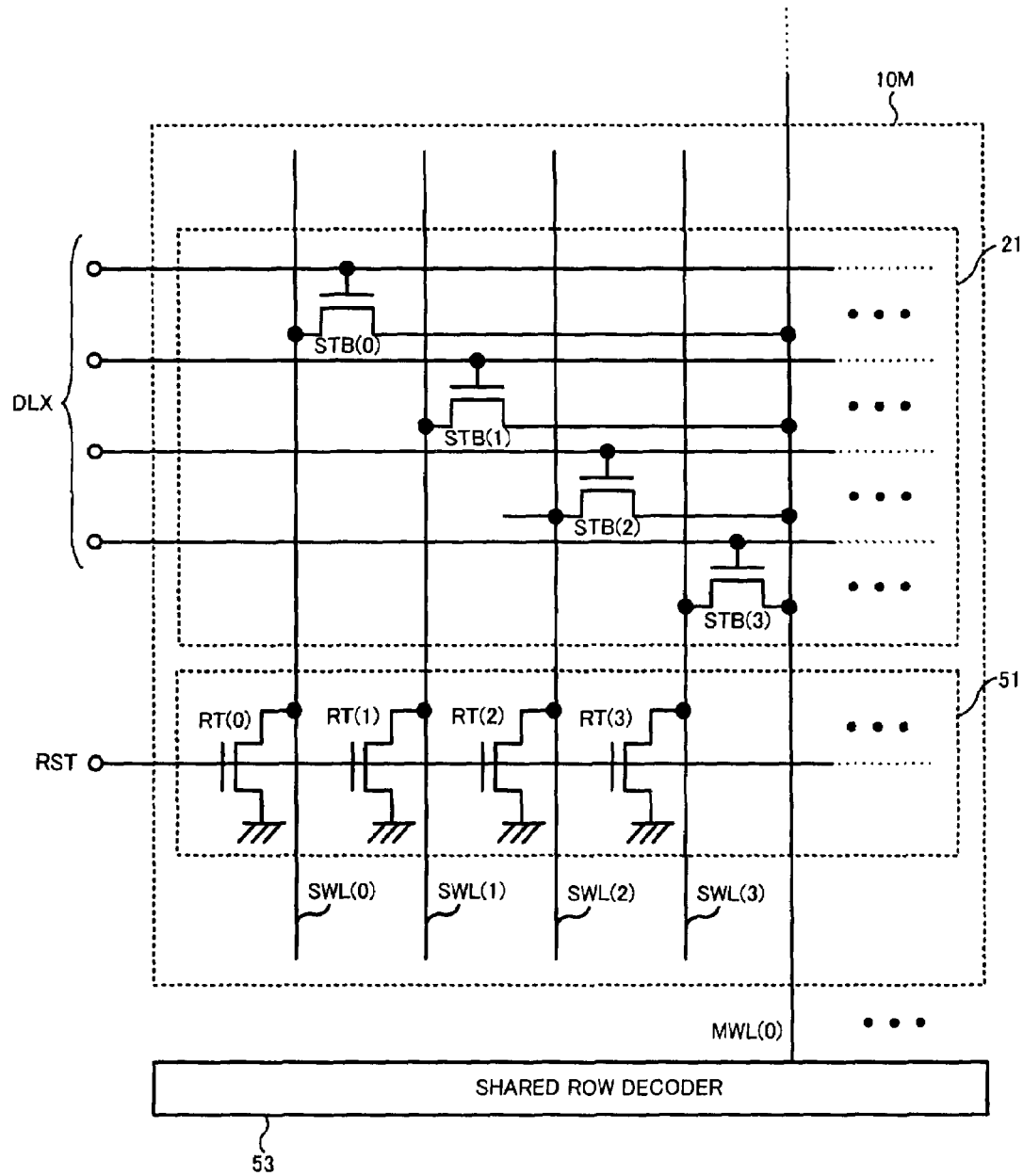
FIG. 16 is a diagram showing a circuit configuration of a sub-word line connection circuit and a reset circuit of the fifth embodiment.

FIG. 16 is a diagram showing a circuit configuration of the sub-word line connection circuit 21 and the reset circuit 51 of FIG. 15. As shown in FIG. 16, the sub-word line connection circuit 21 has the same circuit configuration as that in FIG. 11. Meanwhile, the reset circuit 51 adjacent to the sub-word line connection circuit 21 includes four reset transistors RT having commonly connected gates to which the reset signal RST is applied. The respective reset transistors RT(0) to RT(3) are connected in this order between the sub-word lines SWL(0) to SWL(3) and the ground.

In FIG. 16, when the reset signal RST is low, the four reset transistors RT are off, and the state of each sub-word lines SWL is not affected. On the other hand, when the reset signal RST is high, the four reset transistors RT are on, and the four sub-word lines SWL are forced to be low. In this manner, the role of the reset circuit 51 is to reset each sub-word line SWL in a predetermined LUT 10 at a predetermined timing based on the pipeline control, when one sub-word lines SWL is maintained in an activated state by the main word line MWL.

Figure 17:
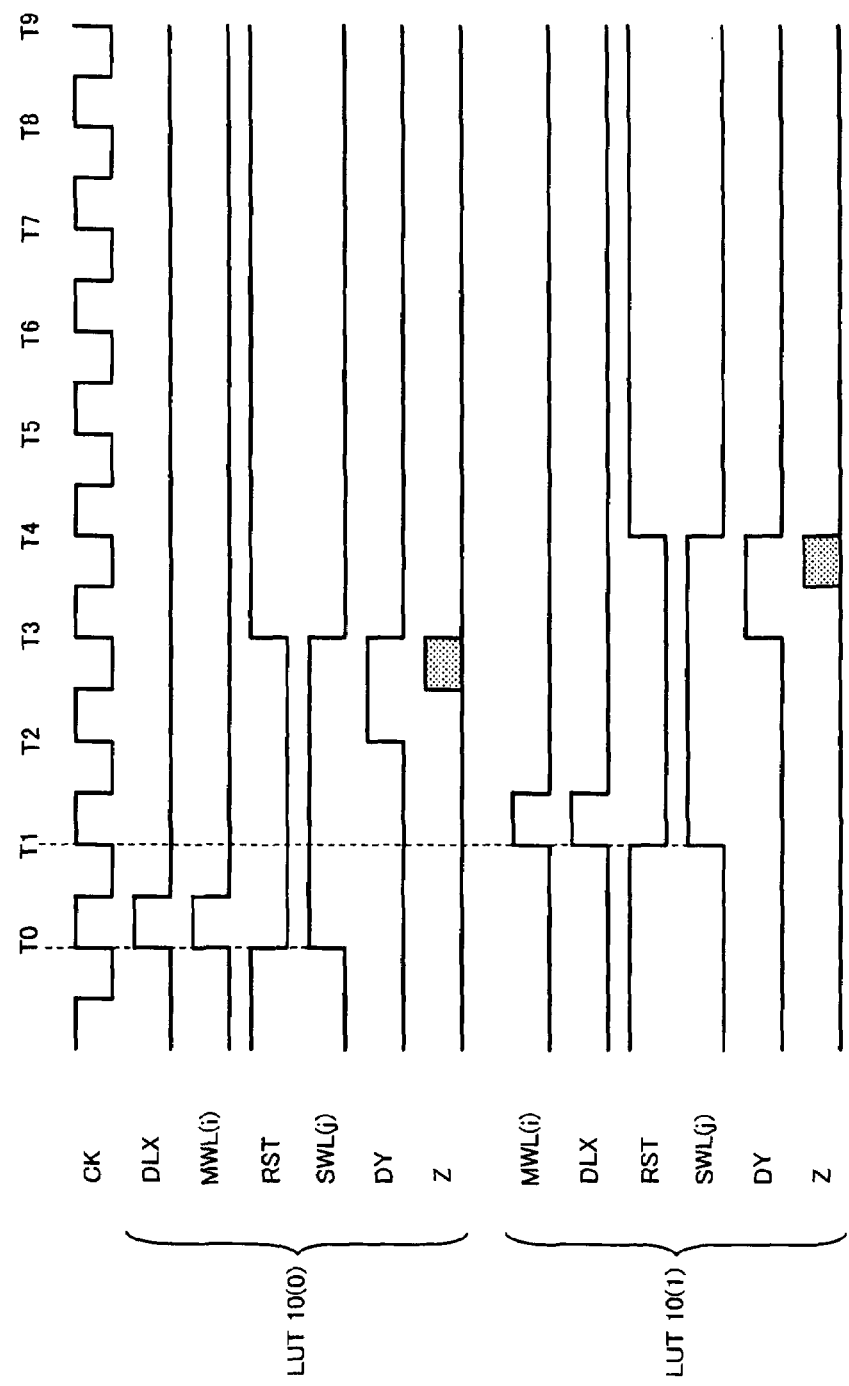
FIG. 17 is an operation waveform diagram corresponding to the pipeline control in which a read operation for adjacent two LUTs of FIG. 15 is exemplified.

Next, the pipeline control for the four LUTs 10 of FIG. 15 will be described. FIG. 17 shows an operation waveform diagram corresponding to the pipeline control in which a read operation for adjacent two LUTs 10(0) and 10(1) of FIG. 15 is exemplified. The pipeline control of the fifth embodiment is performed in synchronization with the clock signal CK having a predetermined period. In FIG. 17, cycles T0 to T9 of the clock signal CK are shown. Here, 12-bit logic input signals X0 to X7, Y0 to Y3 are commonly supplied to each of the four LUTs 10. Thus, an i-th main word line MWL (i) among 64 lines and a j-th sub-word lines SWL(j) among 256 lines are respectively selected as access targets in each LUT 10, and the read operation for the LUT 10(0) corresponding to a predetermined position of the selector 32R is started from a cycle T0. The selected main word line MWL (i) is activated at the cycle T0, and at the same time a predetermined decode signal DLX arises and the selected sub-word lines SWL(j) in the LUT 10(0) is activated. Further, the reset signal RST changes to low at the cycle T0, and the reset state of the sub-word lines SWL is cancelled. When the sub-word line SWL(j) is activated, data of memory cells MC connected to this sub-word line is read on the bit lines BL, and the sense amplifiers SA are activated at a predetermined timing so as to amplify the data on the bit lines.

Then, the amplification of the memory cells MC by the sense amplifier SA is completed after a predetermined delay time elapses, and 16-bit logic output signals Z0 to Z15 corresponding to a pattern of the LUT data are determined. A predetermined decode signal DY arises at a cycle T2, and the respective switch transistors SWT in a selected unit circuit UR of the selector 32R(0) turn on. Thereby, a bit line group BLG corresponding to the selected unit circuit UR is connected to the input/output bus, and the determined 16-bit logic output signals Z0 to Z15 are transmitted through the input/output bus.

Next, a read operation for the second LUT 10(1) is started from a cycle T1 which is one cycle after the read timing for the LUT 10(0), while performing the same control as for the first LUT 10(0). As understood from FIG. 17, the read operation for the first LUT 10(0) is not completed at the cycle T1. The main word line MWL (i), the decode signal DLX, the reset signal RST and the sub-word lines SWL(j) change respectively at the cycle T1, and the decode signal DY changes at the cycle T3. Accordingly, in the selector 32R(1) of the LUT 10(1), the 16-bit logic output signals Z0 to Z15 corresponding to a pattern of the LUT data are determined and transmitted through the input/output bus at a timing delayed one cycle from that of the LUT 10(0).

The pipeline control for the third LUT 10(2) and the fourth LUT 10(3) are performed in the same manner described above. Thereafter, the pipeline control for the four LUTs 10(0) to 10(3) is continuously performed, thereby obtaining the LUT data one by one at every cycle of the clock signal CK. As understood from FIG. 17, it takes a time longer than one cycle to read from a single LUT 10, however employment of the pipeline control allows an increase in substantial read speed for the LUT 10 and the throughput can be improved.

The DRAM macro circuit 6 of the fifth embodiment described above is not limited to the above example, and can be applied to all the configurations of the first to fourth embodiments. Particularly, when the logic circuit 7 of FIG. 2 performs various logic operations in high-speed, the employment of the pipeline control of the fifth embodiment is effective for performing efficient logic operations by increasing the operation speed.

In the foregoing, the present invention is specifically described based on the embodiments. However, the present invention is not limited to the above described five embodiments, and can be variously modified without departing the essentials of the present invention. In the above embodiments, a case to which the present invention is applied using a DRAM circuit as a memory circuit has been described. However, the present invention can be widely applied to cases of using a SRAM or a nonvolatile RAM as the memory circuit. Further, in the above embodiments, a configuration in which the memory circuit of the invention is implemented in a programmable logic LSI has been described. However, the present invention can be widely applied to other semiconductor devices capable of achieving the same function.

The present invention is not limited to the above described embodiments, and various variations and modifications may be possible without departing from the scope of the present invention.

This application is based on the Japanese Patent application No. 2006-294996 filed on Oct. 30, 2006, entire content of which is expressly incorporated by reference herein.

What is claimed is:

1. A memory circuit comprising:

N (N is an integer equal to or larger than two) look-up tables for implementing a desired logic function of L (L is an integer equal to or larger than one) inputs/M (M is an integer equal to or larger than one) outputs by partitioning a memory cell array including a plurality of memory cells into portions each corresponding to at least a predetermined number of input/output paths;

a decode circuit for selecting one of said N look-up tables by decoding a look-up table select signal and for selecting M memory cells to be accessed included in the selected look-up table by decoding an L-bit logic input signal of the logic function; and a select connect circuit for selectively connecting the input/output paths of the M memory cells to be accessed with an input/output bus for transmitting an M-bit logic output signal of the logic function in response to a decoded result of said decode circuit.

2. The memory circuit according to claim 1, wherein when reading from the selected look-up table, the M-bit logic output signal read from the M memory cells to be accessed is output to the input/output bus through said select connect circuit, and when writing to the selected look-up table, M-bit input data input from outside through the input/output bus is written to the M memory cells to be accessed through said select connect circuit.

3. The memory circuit according to claim 1, wherein each of said look-up tables is configured by partitioning a memory cell array including a plurality of memory cells formed at intersections between a plurality of word lines and a plurality of bit lines into portions each corresponding to at least a predetermined number of bit lines, and said decode circuit generates a plurality of decode signals for selecting word lines and bit lines corresponding to the M memory cells to be accessed.

4. A semiconductor device comprising:

a plurality of logic blocks each including a plurality of memory circuits in which said N look-up tables according to claim 1 are configured, and a logic circuit for performing a predetermined logic function by selectively reading from said N look-up tables through the input/output bus by said select connect circuit; and a plurality of connecting circuits for changeably setting a connection state between the plurality of logic blocks.

5. A read control method for performing an read operation for said N look-up tables according to claim 1 in a predetermined reading order, comprising the steps of:

performing a first read operation in which the L-bit logic input signal is supplied to said decode circuit at a first timing, the look-up table of a first position of the reading order is selected based on the look-up table select signal, the M memory cells to be accessed are selected and accessed, and the M-bit logic output signal is read through the input/output bus after a predetermined delay time elapses from the first timing;

performing a second read operation in which the L-bit logic input signal is supplied to said decode circuit at a second timing, the look-up table of a second position of the reading order is selected based on the look-up table select signal, the M memory cells to be accessed are selected and accessed, and the M-bit logic output signal is read through the input/output bus after a predetermined delay time elapses from the second timing; and performing read operations for all said look-up tables included in the reading order by repeatedly performing a series of operations in which the first read operation is performed for a preceding look-up table and the second read operation is performed for a subsequent look-up table.

6. The memory circuit according to claim 3, wherein said decode circuit includes a row decoder for selectively activating the plurality of word lines by decoding part of the L-bit logic input signal, and a complex decoder for selecting one of said N look-up tables by decoding the look-up table select signal and for selecting a bit line group corresponding to the M memory cells to be accessed by decoding the other part of the L-bit logic input signal.

7. The memory circuit according to claim 3, wherein a plurality of sense amplifiers connected to the plurality of bit lines and said select connect circuit for selectively connecting the plurality of sense amplifiers to the input/output bus are arranged at one ends in a bit line extending direction of said N look-up tables.

8. The memory circuit according to claim 3, wherein a plurality of sense amplifiers connected to the plurality of bit lines and said select connect circuit for selectively connecting the plurality of sense amplifiers to M/2-bit lines included in the input/output bus are arranged symmetrically at both ends in a bit line extending direction of said N look-up tables.

9. The memory circuit according to claim 3, wherein the memory cell array is divided into a plurality of unit blocks aligned in a bit line extending direction, said N look-up tables are configured in each of the unit blocks, said select connect circuit is dividedly arranged at both ends of the plurality of unit blocks and between adjacent two unit blocks, and said select connect circuit arranged between the two unit blocks are shared by 2N said look-up tables on the both sides.

10. The memory circuit according to claim 6, wherein
a word line hierarchy structure including a plurality of main word lines selectively activated by the row decoder and a plurality of sub-word lines arranged individually for each of said look-up tables is formed,
and a sub-word line connection circuit for switching connection between the plurality of main word lines and the plurality of sub-word lines is provided in each of said look-up tables.

11. The memory circuit according to claim 10, wherein
a predetermined number of the sub-word lines are corresponded to each of the main word lines in the word line hierarchy structure,
and the sub-word line connection circuit is capable of selectively connecting a selected main word line to one of the predetermined number of sub-word lines corresponding to a decoded result of said decode circuit.

12. The memory circuit according to claim 7, wherein said select connect circuit includes N selectors corresponding to said plurality of look-up tables, and each of the selectors selectively connects M sense amplifiers corresponding to the decode signal with the input/output bus of M bits.

13. The memory circuit according to claim 12, wherein the respective selector includes a plurality of unit circuits arranged corresponding to the M sense amplifiers, and the M sense amplifiers are connected to the input/output bus of M bits through one unit circuit selected in response to the decode signal.

14. The memory circuit according to claim 8, wherein said select connect circuit includes 2N selectors corresponding to said look-up tables, and each of the selectors selectively connects M/2 sense amplifiers corresponding to the decode signal with M/2-bits lines included in the input/output bus.

15. The memory circuit according to claim 14, wherein the respective selector includes a plurality of unit circuits arranged corresponding to the M/2 sense amplifiers, and the M/2 sense amplifiers are connected to the M/2-bit lines included in the input/output bus through one unit circuit selected in response to the decode signal.

16. The semiconductor device according to claim 4, wherein the memory circuit is a DRAM circuit.

17. The read control method according to claim 5, wherein the first and second operations are controlled in synchronization with a clock signal having a predetermined period, and a time difference between the first and second timings is equal to one cycle of the clock signal.

* * * * *